United States Patent
Tsunoda

(10) Patent No.: US 9,231,532 B2
(45) Date of Patent: Jan. 5, 2016

(54) AMPLIFIER CIRCUIT

(71) Applicant: FUJITSU LIMITED, Kawasaki-shi, Kanagawa (JP)

(72) Inventor: Yukito Tsunoda, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 66 days.

(21) Appl. No.: 13/975,690

(22) Filed: Aug. 26, 2013

(65) Prior Publication Data

US 2014/0132351 A1    May 15, 2014

(30) Foreign Application Priority Data

Nov. 14, 2012   (JP) ................................. 2012-250540

(51) Int. Cl.
| | | |
|---|---|---|
| *H03F 3/343* | (2006.01) | |
| *H03F 1/48* | (2006.01) | |
| *H03F 3/45* | (2006.01) | |

(52) U.S. Cl.
CPC .............. *H03F 1/48* (2013.01); *H03F 3/45085* (2013.01); *H03F 2203/45521* (2013.01); *H03F 2203/45522* (2013.01); *H03F 2203/45722* (2013.01)

(58) Field of Classification Search
USPC .................................. 330/291, 252–261, 85
See application file for complete search history.

(56) References Cited

U.S. PATENT DOCUMENTS

| | | | |
|---|---|---|---|
| 7,091,773 B1 * | 8/2006 | Brunn et al. ..................... 330/85 |
| 8,089,316 B2 * | 1/2012 | Park et al. ...................... 330/258 |
| 2003/0214356 A1 * | 11/2003 | Cowley et al. ................ 330/254 |
| 2011/0181271 A1 | 7/2011 | Chujo et al. | |
| 2012/0062143 A1 | 3/2012 | Sugawara et al. | |

FOREIGN PATENT DOCUMENTS

| | | |
|---|---|---|
| JP | 6-19312 | 3/1994 |
| JP | 2011-155368 | 8/2011 |
| JP | 2011-223586 | 11/2011 |
| JP | 2012-80061 | 4/2012 |

OTHER PUBLICATIONS

J. Abbott et al., "A 15 GHz, 1.8V, Variable-Gain, Modified Cherry-Hooper Amplifier," *IEEE 2005 Custom Integrated Circuits Conference*, 2005, pp. 645-648.

* cited by examiner

*Primary Examiner* — Hieu Nguyen

(74) *Attorney, Agent, or Firm* — Staas & Halsey LLP

(57) ABSTRACT

An amplifier circuit includes an amplifier circuit that emitter-grounds a first transistor that amplifies an input signal; and an emitter-grounded feedback circuit in which a collector of the first transistor is connected to an output line of the amplifier circuit and a base is wiring-connected only to the output line by using a resistor.

10 Claims, 12 Drawing Sheets

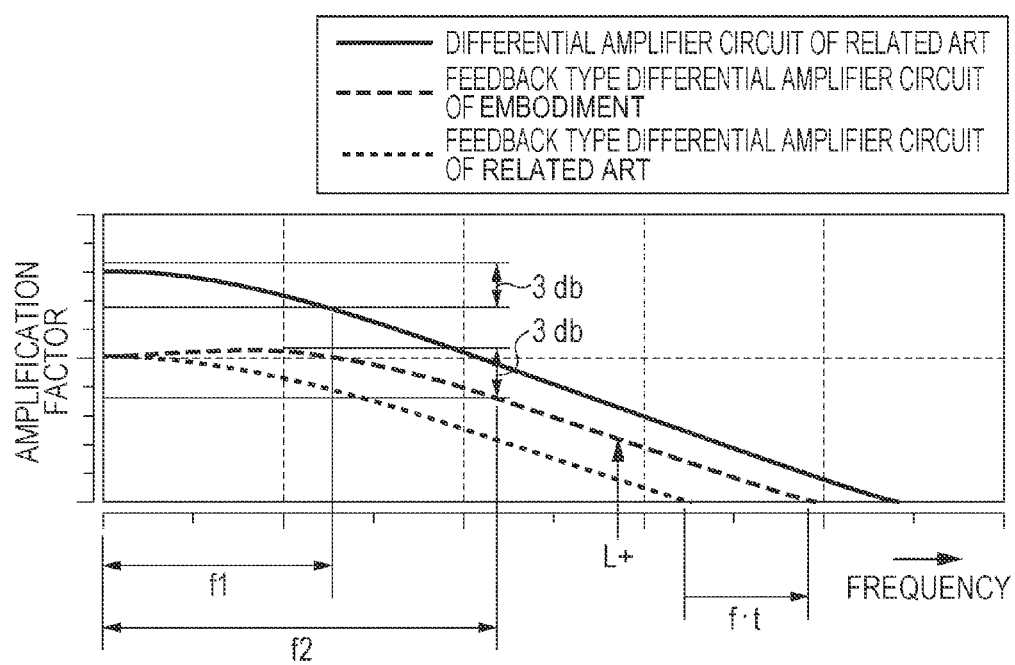

AMPLIFIER CIRCUIT

CROSS-REFERENCE TO RELATED APPLICATION

This application is based upon and claims the benefit of priority of the prior Japanese Patent Application No. 2012-250540, filed on Nov. 14, 2012, the entire contents of which are incorporated herein by reference.

FIELD

The embodiments discussed herein are related to an amplifier circuit which amplifies a signal.

BACKGROUND

In recent years, speeding up of a data rate has been advanced so as to transmit a large volume of data by one signal, along with increase of a data communication amount in a field of communication. With this speeding up, a circuit which meets a high speed for amplifying, shaping, and driving a high-speed signal is demanded. As an amplifier circuit for amplifying a signal, a grounded-emitter amplifier circuit, a differential grounded-emitter amplifier circuit thereof, and the like are widely used. In these amplifier circuits, parasitic capacitances of collector of a transistor, a wiring, an additional circuit, and the like cause deterioration of a band, an insufficient frequency property (lack of a high frequency range), and insufficient rising/falling in an eye waveform, and jitter increase, bringing difficulty in speeding up.

A feedback type high-speed amplifier circuit (refer to FIG. 2 of Justin Abbott, Calvin Plett, John W. M. Rogers, "A 15 GHz, 1.8V, Variable-Gain, Modified Cherry-Hooper Amplifier", IEEE 2005 CUSTOM INTEGRATED CIRCUITS CONFERENCE, 22-5-1 to 22-5-4, p.645 to p.648, for example) has been disclosed as a speeding-up measure. This circuit subtracts low-speed components from a signal by a feedback circuit so as to realize a wider bandwidth and speeding up.

However, even in the feedback type high-speed amplifier circuit, a parasitic capacitance of the added feedback circuit further causes deterioration of a band and jitter increase, bringing difficulty in realizing sufficient speeding up. A factor interfering the speeding up is increase of a parasitic capacitance caused by a feedback circuit ($C_2$ in a formula (5) in Justin Abbott, Calvin Plett, John W. M. Rogers, "A 15 GHz, 1.8V, Variable-Gain, Modified Cherry-Hooper Amplifier", IEEE 2005 CUSTOM INTEGRATED CIRCUITS CONFERENCE, 22-5-1 to 22-5-4, p.645 to p.648). Especially, a base parasitic capacitance of a transistor of the feedback circuit is the main factor of deterioration. Further, the speeding up is performed by performing subtraction from a main signal by a feedback circuit. However, not only low-speed components but also high-speed components are subtracted in this configuration. Therefore, the high-speed components are further deteriorated, causing difficulty in realizing of a wider bandwidth and speeding up.

SUMMARY

According to an aspect of the invention, an amplifier circuit includes an amplifier circuit that emitter-grounds a first transistor that amplifies an input signal; and an emitter-grounded feedback circuit in which a collector of the first transistor is connected to an output line of the amplifier circuit and a base is wiring-connected only to the output line by using a resistor.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 2 is a graph illustrating a frequency property of the amplifier circuit according to the first embodiment;

DESCRIPTION OF EMBODIMENTS

Figure 1:
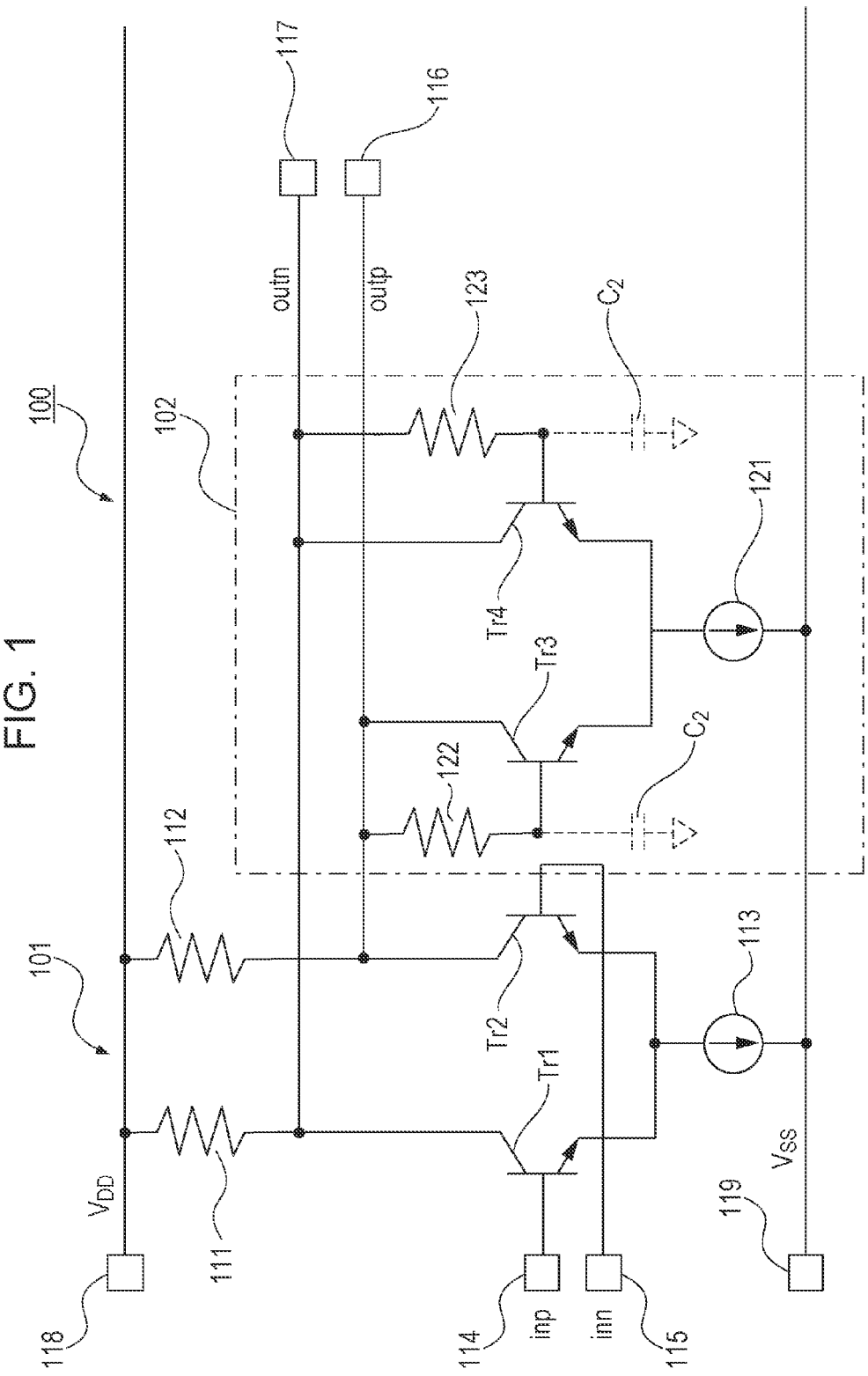
FIG. 1 illustrates an amplifier circuit according to a first embodiment.

Preferable embodiments of the present disclosure are described in detail below with reference to the accompanying drawings. FIG. 1 illustrates an amplifier circuit according to a first embodiment.

This amplifier circuit 100 includes a differential amplifier circuit 101 and a feedback circuit 102. The differential amplifier circuit 101 includes a pair of (two pieces of) transistors Tr1 and Tr2, two pieces of loads (resistors) 111 and 112, a current source 113, two pieces of input terminals (inp) 114 and (inn) 115, and two pieces of output terminals 116 and 117.

A base of the first transistor Tr1 is connected with the first input terminal 114. A collector of the first transistor Tr1 is connected with one end of the first resistor 111 and with the second output terminal (signal line outn) 117. A base of the second transistor Tr2 is connected with the second input terminal 115. A collector of the second transistor Tr2 is connected with one end of the second resistor 112 and with the first output terminal (signal line outp) 116.

The other end of the first resistor 111 and the other end of the second resistor 112 are commonly connected with a power source terminal 118 to which power source voltage $V_{DD}$ is applied. Emitters of the first transistor Tr1 and the second transistor Tr2 are commonly connected and are connected to the current source 113 which is provided between the emitters and a power source terminal 119 to which power source voltage $V_{SS}$ is applied.

The differential amplifier circuit 101 having the above-mentioned configuration amplifies a difference between signals which are inputted into a pair of input terminals 114 and 115 and outputs signals having mutually different phases (a positive phase and a reversed phase) from a pair of output terminals 116 and 117 respectively.

The feedback circuit 102 includes a pair of (two pieces of) transistors Tr3 and Tr4 for a differential operation, a current source (tail current source) 121, and two pieces of resistors 122 and 123. Collectors of the transistors Tr3 and Tr4 are respectively connected with the positive phase signal line outp and the reversed phase signal line outn. The positive phase signal line outp is coupled to a base of the transistor Tr3, which is connected to the positive phase signal line outp, via the resistor 122. The reversed phase signal line outn is coupled to a base of the transistor Tr4, which is connected to the reversed phase signal line outn, via the resistor 123. These resistors 122 and 123 are respectively connected between the base of the transistor Tr3 and the positive phase signal line and between the base of the transistor Tr4 and the reversed polarity phase signal line in series.

The transistors Tr3 and Tr4 of the feedback circuit 102 have such configurations that a signal inputted into the collector and the base travels through the identical signal line (outp, outn) and the signal is directly fed back to the differential amplifier circuit 101. Therefore, the differential amplifier circuit 101 is enabled to directly widen a bandwidth of an inputted signal and thus perform a high-speed operation, without being affected by a deterioration effect of a non-linear component of the feedback circuit 102, a limiter, and the like.

According to the above-described configuration, it is possible to shield a parasitic capacitance $C_2$ of the bases of the transistors Tr3 and Tr4 of the feedback circuit 102 by the resistors 122 and 123 provided to the feedback circuit 102. Accordingly, it is possible to exclude deterioration imposed on the signal lines outp and outn.

Further, a RC filter composed of the resistors 122 and 123 and the parasitic capacitances $C_2$ of the bases of the transistors Tr3 and Tr4 is obtained and only low-frequency components are fed back to be subtracted from a main signal (signal line). Accordingly, it is possible to suppress lowering of high-speed (high frequency range) components in the subtraction amount in the feedback circuit 102 and further realize a wider bandwidth of the frequency property and speeding up of an operation.

Further, the configuration that allows current adjustment of the current sources 113 and 121 depicted in FIG. 1 and variable resistance of the resistors 122 and 123 depicted in FIG. 1 may be employed. Though this point will be described in other embodiments below, the current adjustment of the current sources 113 and 121 or the variable resistance of the resistors 122 and 123 enables band adjustment.

FIG. 2 is a graph illustrating a frequency property of the amplifier circuit according to the first embodiment. The horizontal axis represents a frequency and the vertical axis represents an amplification factor. As depicted, though an amplification factor is high, the curve slopes downward overall in a differential amplifier circuit of related art. Namely, such frequency property that as the frequency is increased, the amplification factor is lowered is exhibited (bandwidth f1). Further, in a feedback type differential amplifier circuit of related art, the frequency property is flat compared to the differential amplifier circuit of related art, but the frequency in a high frequency range is deteriorated.

On the other hand, the feedback type differential amplifier circuit of the embodiment is capable of suppressing lowering of high frequency range components and improving the frequency property in the high frequency range, being able to flat the frequency properly over a wide frequency and widen a bandwidth of the frequency property to a bandwidth f2. A band is expressed by a frequency range from a peak of the amplification factor to the amplification factor obtained by lowering the amplification factor by a predetermined level (3 dB), for example.

Figure 3A:
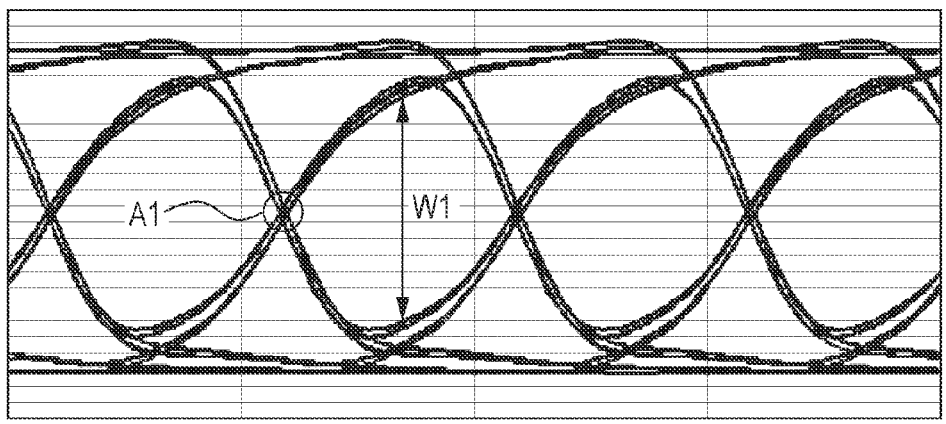
FIGS. 3A to 3C are graphs illustrating temporal waveforms (eye openings) of differential signals of the amplifier circuit according to the first embodiment.
Figure 3B:
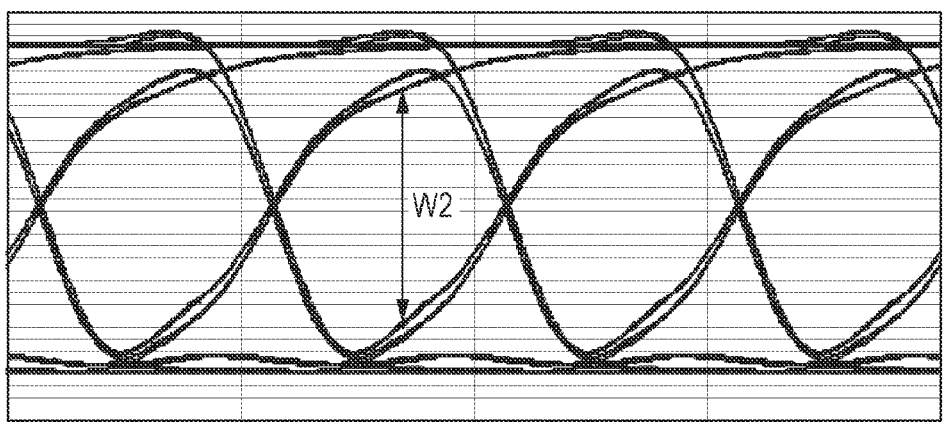
Figure 3C:
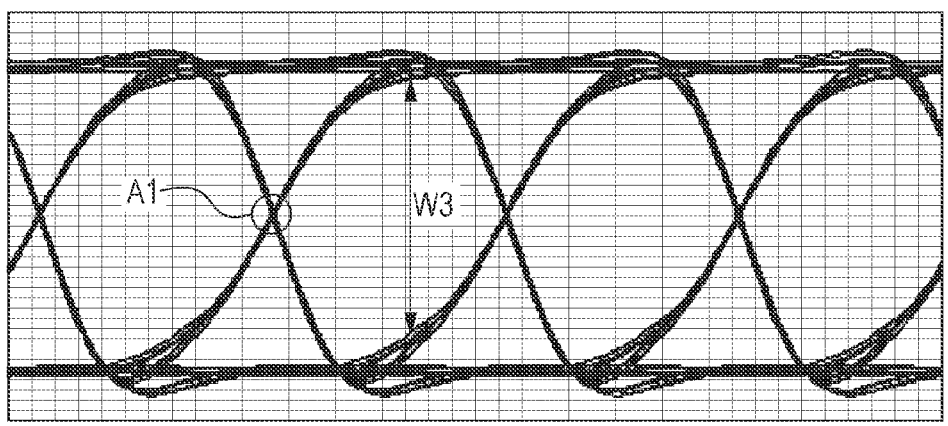

FIGS. 3A to 3C are graphs illustrating temporal waveforms (eye opening) of differential signals of the amplifier circuit according to the first embodiment. In a differential amplifier circuit of related art depicted in FIG. 3A, an eye opening W1 is narrow, a gap is generated on a cross point A1 due to an effect of jitters, and rising and falling properties of signals are poor. In a feedback type differential amplifier circuit of related art depicted in FIG. 3B, an eye opening W2 is narrow. On the other hand, the feedback type differential amplifier circuit of the embodiment depicted in FIG. 3C makes the cross point A1 finely clear by jitter reduction, is capable of sufficiently widening an eye opening W3, and thus is capable of improving rising and falling properties of signals.

According to the first embodiment described above, the resistor is serially-provided between the base of the feedback circuit which is added to the differential amplifier circuit and the signal line, so that the parasitic capacitance of the base of the feedback circuit is shielded by the resistor, being able to largely reduce an effect of the parasitic capacitance and realize a wider bandwidth. Further, the serial resistor and the parasitic capacitance of the base serve as a RC filter, enabling the feedback circuit to feed back and subtract only low frequency components. Accordingly, it becomes possible to avoid deterioration of high-speed (high frequency range) components, subtract only low speed components, and speed up an operation.

Further, the feedback circuit 102 uses bipolar type transistors Tr3 and Tr4 and signals of collectors and bases of the transistors Tr3 and Tr4 have voltage of the same polarity, so that potential reversing between the base and the collector in the bipolar type transistors Tr3 and Tr4 does not occur.

Figure 4:
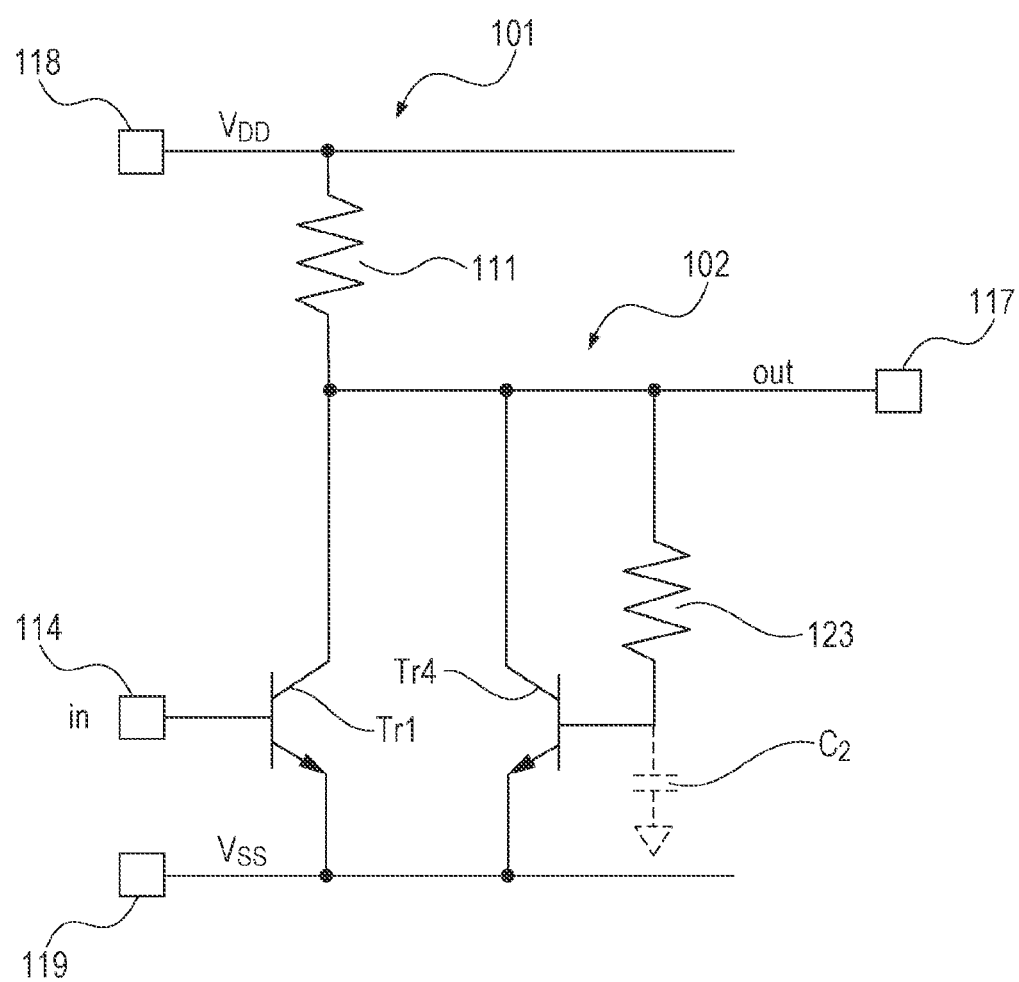
FIG. 4 illustrates an amplifier circuit according to a second embodiment.

FIG. 4 illustrates an amplifier circuit according to a second embodiment. In the second embodiment, the amplifier circuit has the grounded emitter configuration of single amplification. In FIG. 4, elements same as those of the first embodiment (FIG. 1) are given the same reference characters and an amplifier circuit and a feedback circuit are only one of a differential pair. Even in a case of the single amplification, a grounded-emitter amplifier circuit 101 is applicable similarly to the first embodiment.

The amplifier circuit 101 includes one piece of transistor Tr1, one piece of resistor 111, one piece of input terminal (in) 114, and one piece of output terminal 117.

A base of the first transistor Tr1 is connected with the input terminal 114. A collector of the first transistor Tr1 is connected with one end of the resistor 111 and with the output terminal (signal line out) 117. The other end of the resistor 111 is connected with the power source terminal 118 to which power source voltage $V_{DD}$ is applied. An emitter of the first transistor Tr1 is ground-connected to the power source terminal 119 to which power source voltage $V_{SS}$ is applied.

The feedback circuit 102 includes one piece of transistor Tr4 and one piece of resistor 123. A collector of the transistor Tr4 is connected to the signal line out. Further, the signal line out is connected to a base of the transistor Tr4 which is connected to the signal line out, via the resistor 123. Namely, the resistor 123 is connected between the base of the transistor Tr4 and the signal line in series. The transistor Tr4 of the feedback circuit 102 has such configuration that a signal inputted into the collector and the base travels through the identical signal line (out) and the signals is directly fed back to the amplifier circuit 101.

According to the above-mentioned configuration, provision of the feedback circuit 102 similarly to the first embodiment brings the advantageous effect same as that of the first embodiment in the amplifier circuit 101 of single amplification as well. Namely, the resistor 123 provided to the feedback circuit 102 is capable of shielding the parasitic capacitance $C_2$ of the base of the transistor Tr4 of the feedback circuit 102. Accordingly, it is possible to exclude deterioration imposed on the signal line out.

Further, a RC filter composed of the resistor 123 and the parasitic capacitance $C_2$ of the base of the transistor Tr4 is obtained, so that only low frequency components are fed back and subtracted from a main signal (signal line). Accordingly, it is possible to avoid lowering of high-speed (high frequency range) components in a subtraction amount in the feedback circuit 102 and further realize a wider bandwidth of a frequency properly and speeding up of an operation.

Figure 5:
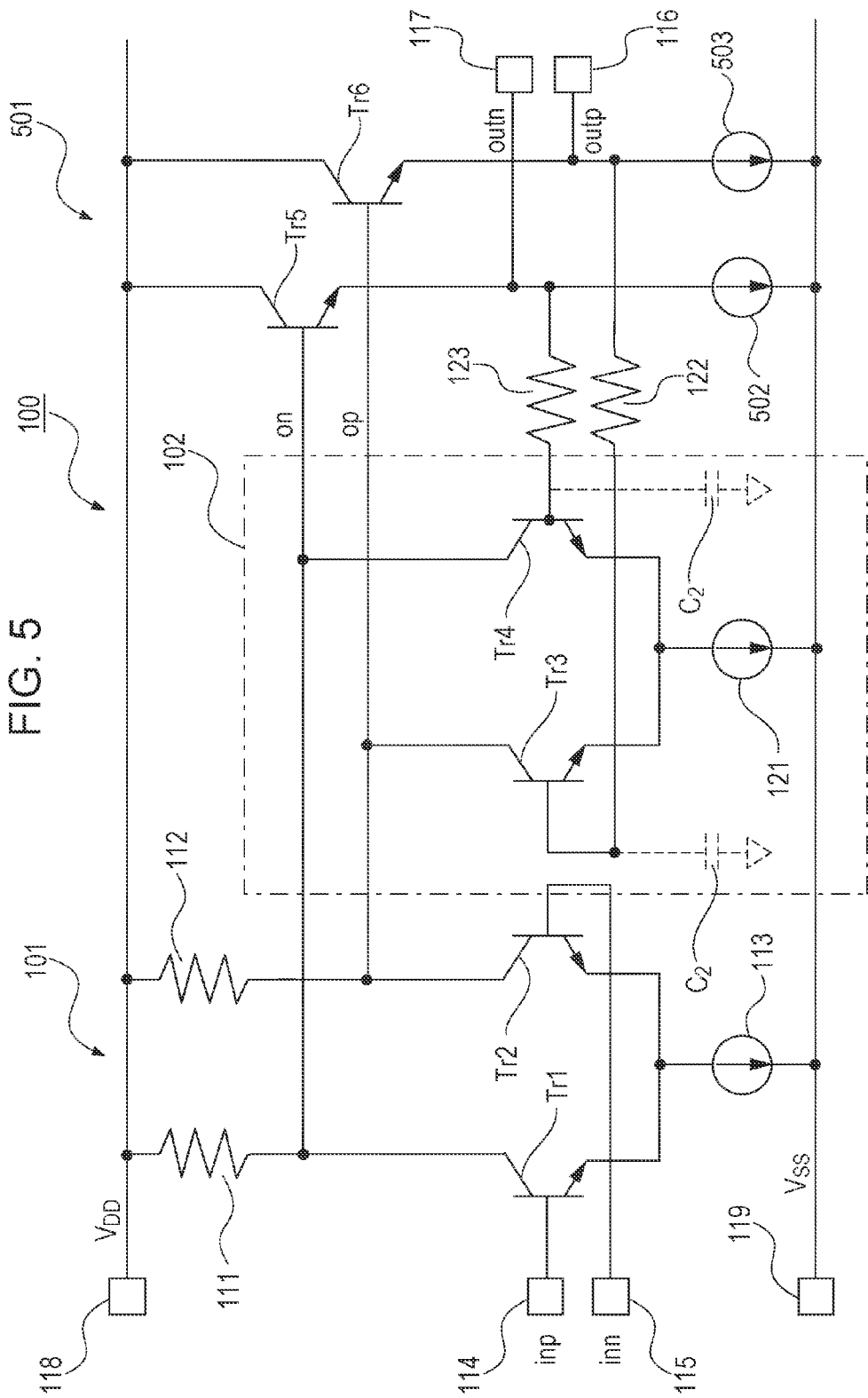
FIG. 5 illustrates an amplifier circuit according to a third embodiment.

FIG. 5 illustrates an amplifier circuit according to a third embodiment. In the third embodiment, an emitter-follower circuit 501 is added to an output stage of the configuration of the first embodiment (FIG. 1). The configurations of the differential amplifier circuit 101 and the feedback circuit 102 are same as those of the first embodiment (FIG. 1), so that the description thereof is omitted.

A signal line on to which the collector of the transistor Tr1 of the differential amplifier circuit 101 and the collector of the transistor Tr4 of the feedback circuit 102 are connected is connected with a base of a fifth transistor Tr5 which is included in the emitter-follower circuit 501. A signal line op to which the collector of the transistor Tr2 of the differential amplifier circuit 101 and the collector of the transistor Tr3 of the feedback circuit 102 are connected is connected with a base of a sixth transistor Tr6 which is included in the emitter-follower circuit 501.

Collectors of the transistors Tr5 and Tr6 constituting the emitter-follower circuit 501 are connected to the power source terminal 118 to which power source voltage $V_{DD}$ is applied. Further, emitters are respectively connected to a current source 502, which is provided between the emitter of the transistor Tr5 and the power source terminal 119 to which power source voltage $V_{SS}$ is applied, and to a current source 503, which is provided between the emitter of the transistor Tr6 and the power source terminal 119. Further, the emitter of the fifth transistor Tr5 is connected with the second output terminal (outn) 117 and is connected with the current source 502 which is provided between the emitter of the transistor Tr5 and the power source terminal 119 to which power source voltage $V_{SS}$ is applied. The emitter of the sixth transistor Tr6 is connected with the first output terminal (outp) 116 and is connected with the current source 503 which is provided between the emitter of the transistor Tr6 and the power source terminal 119 to which power source voltage $V_{SS}$ is applied.

The base of the transistor Tr3 of the feedback circuit 102 is coupled with the positive phase signal line (outp) via the resistor 122. The base of the transistor Tr4 of the feedback circuit 102 is coupled with the reversed phase signal line (outn) via the resistor 123.

According to the third embodiment described above, the emitter-follower circuit which is provided on the output stage does not have a voltage gain and enables a wider bandwidth and speeding up without being affected by an effect of a non-linear component of a signal component, a limiter, and the like while maintaining a signal waveform.

Figure 6:
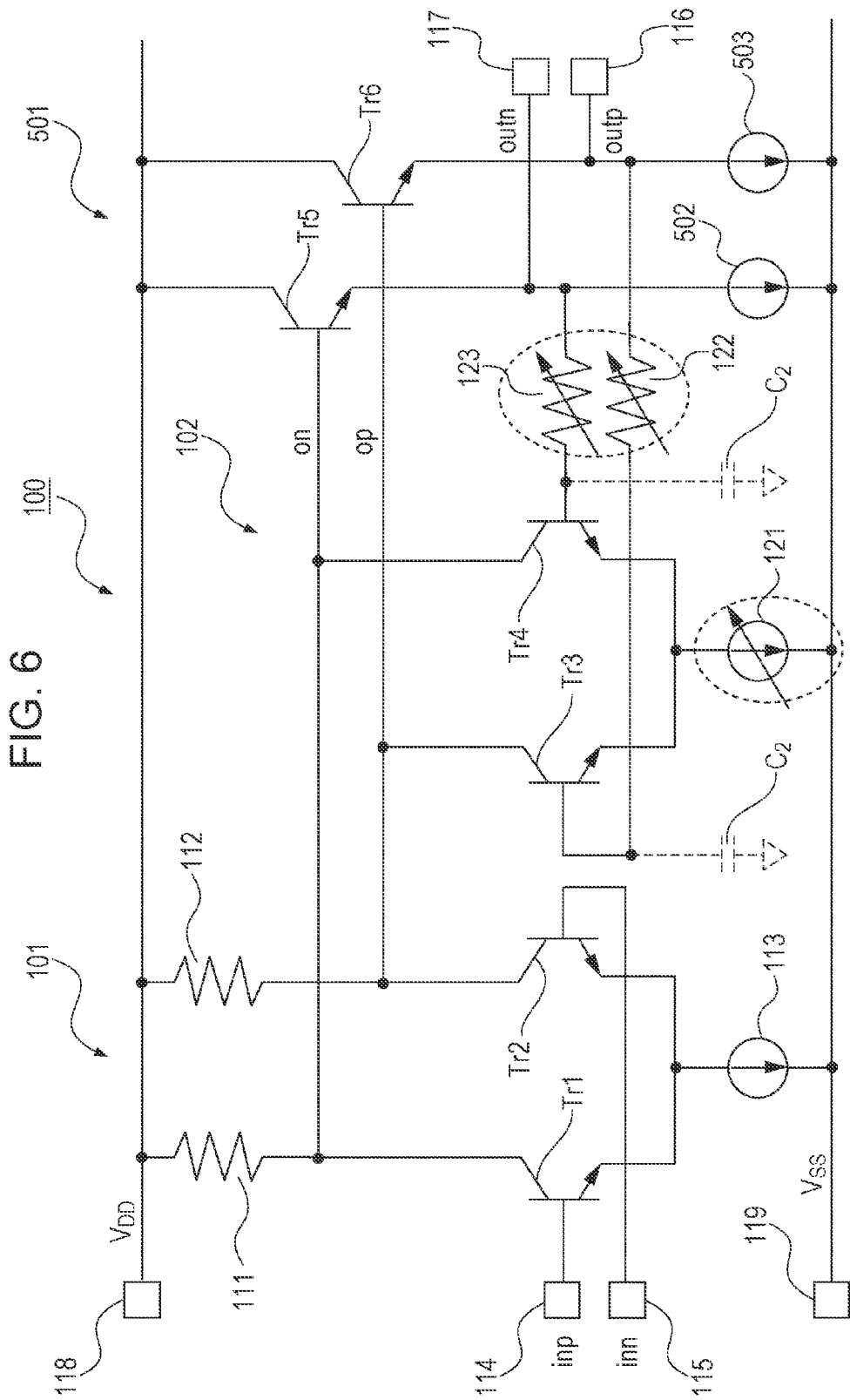
FIG. 6 illustrates an amplifier circuit according to a fourth embodiment.

FIG. 6 illustrates an amplifier circuit according to a fourth embodiment. The fourth embodiment is a configuration example of varying a frequency properly, and the current source 121 or the resistors 122 and 123 which are illustrated in the third embodiment (FIG. 5) are configured to be variable.

Here, the amplifier circuit 100 of the respective embodiments described above is capable of easily adjusting a feedback amount in the feedback circuit 102 because the differential amplifier circuit 101 of a signal system and the feedback circuit 102 of a feedback system are independently provided.

Figure 7:
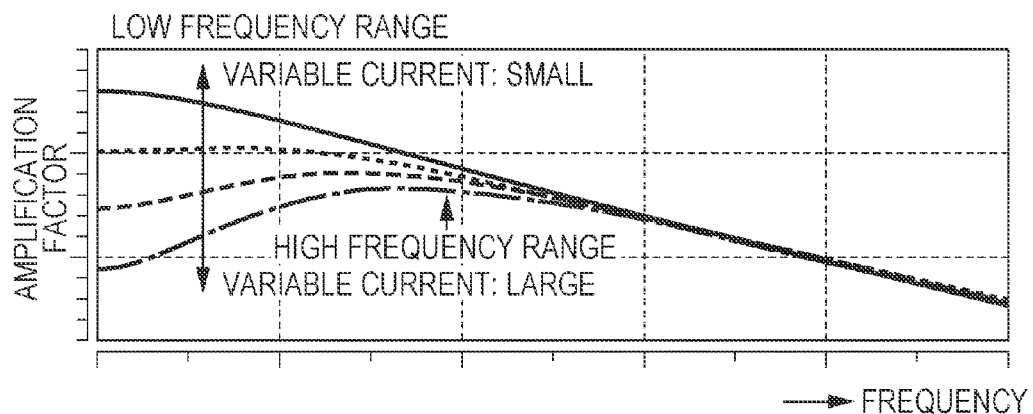
FIG. 7 is a graph illustrating a frequency property of the amplifier circuit according to the fourth embodiment (I)

FIG. 7 is a graph illustrating the frequency property of the amplifier circuit according to the fourth embodiment. The current source 121 of the transistors Tr3 and Tr4 of the feedback circuit 102 is set to be a variable current source, enabling adjustment of the feedback amount of a low frequency range of the feedback circuit 102, that is, an intensity (level) of in the low frequency range. Accordingly, it is possible to relatively enhance the intensity of a high frequency range. When the current amount of the current source 121 of the feedback circuit 102 is decreased, the intensity of the low frequency range is increased. When the current amount of the current source 121 is increased, the intensity of the low frequency range is decreased, being able to relatively increase the intensity of the high frequency range.

Figure 8:
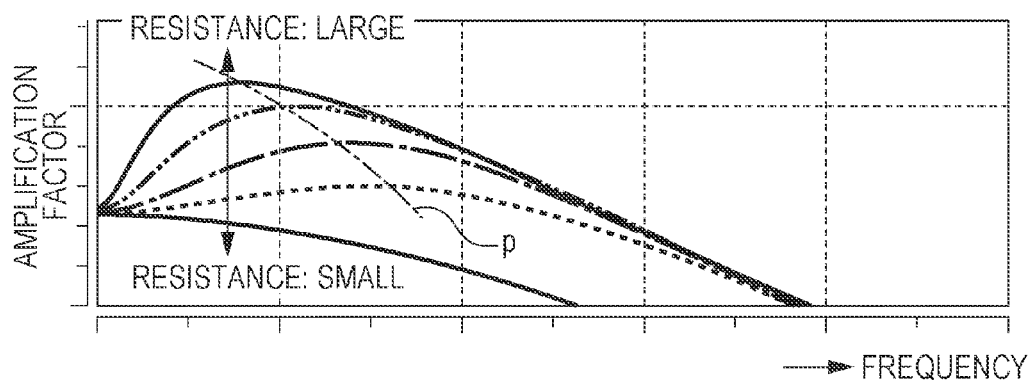
FIG. 8 is a graph illustrating a frequency property of the amplifier circuit according to the fourth embodiment (II)

FIG. 8 is another graph illustrating the frequency property of the amplifier circuit according to the fourth embodiment. It is assumed that the resistors 122 and 123 which are respectively connected to the bases of the transistors Tr3 and Tr4 of the feedback circuit 102 in series are variable resistors. Accordingly, it is possible to change a parameter of a RC circuit which is composed of the resistors 122 and 123 which are respectively connected to the bases of the transistors Tr3 and Tr4 in series and the parasitic capacitances $C_2$ of the bases and to adjust a low frequency range of the feedback amount. Accordingly, it is possible to relatively adjust the intensity of the high frequency range. As depicted in FIG. 8, as resistance values of the resistors 122 and 123 are larger, the intensity in the low frequency range is increased, while, as the resistance values of the resistors 122 and 123 are decreased, the intensity of the low frequency range is decreased, being able to relatively increase the intensity in the high frequency range. Here, as depicted in FIG. 8, by varying the resistance values of the resistors 122 and 123, a peak of the frequency property is shifted in the frequency direction (p in FIG. 8), being able to obtain a flat frequency property on the basis of the varying of the resistance values.

Figure 9:
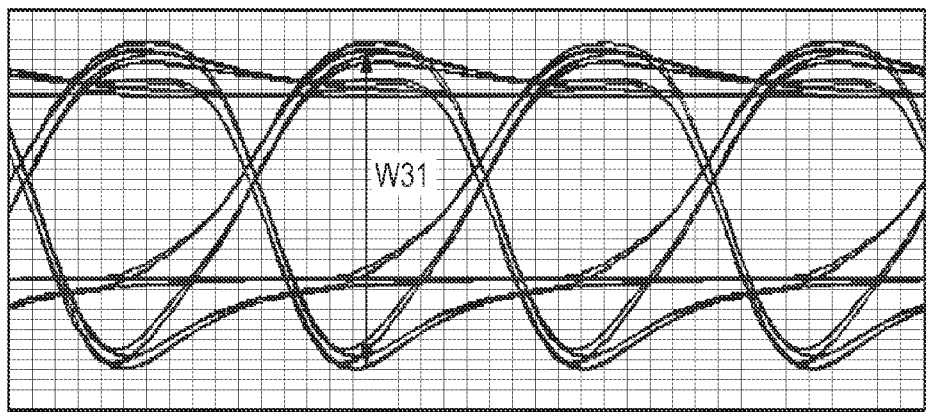
FIG. 9 is a graph illustrating a temporal waveform (eye opening) of a differential signal of the amplifier circuit according to the fourth embodiment.

FIG. 9 is a graph illustrating a temporal waveform (eye opening) of a differential signal of the amplifier circuit according to the fourth embodiment. As described above, employment of the configuration in which the current source 121 or the resistors 122 and 123 are variable enables adjustment of a band in a high frequency range in which intensity compensation is performed. For example, the current source 121 or the resistors 122 and 123 functions as an equalizer which adjusts the frequency property. Accordingly, it is possible to obtain an eye opening W31 which is wider than the eye opening W3 of the embodiment (refer to FIG. 3C).

Figure 10:
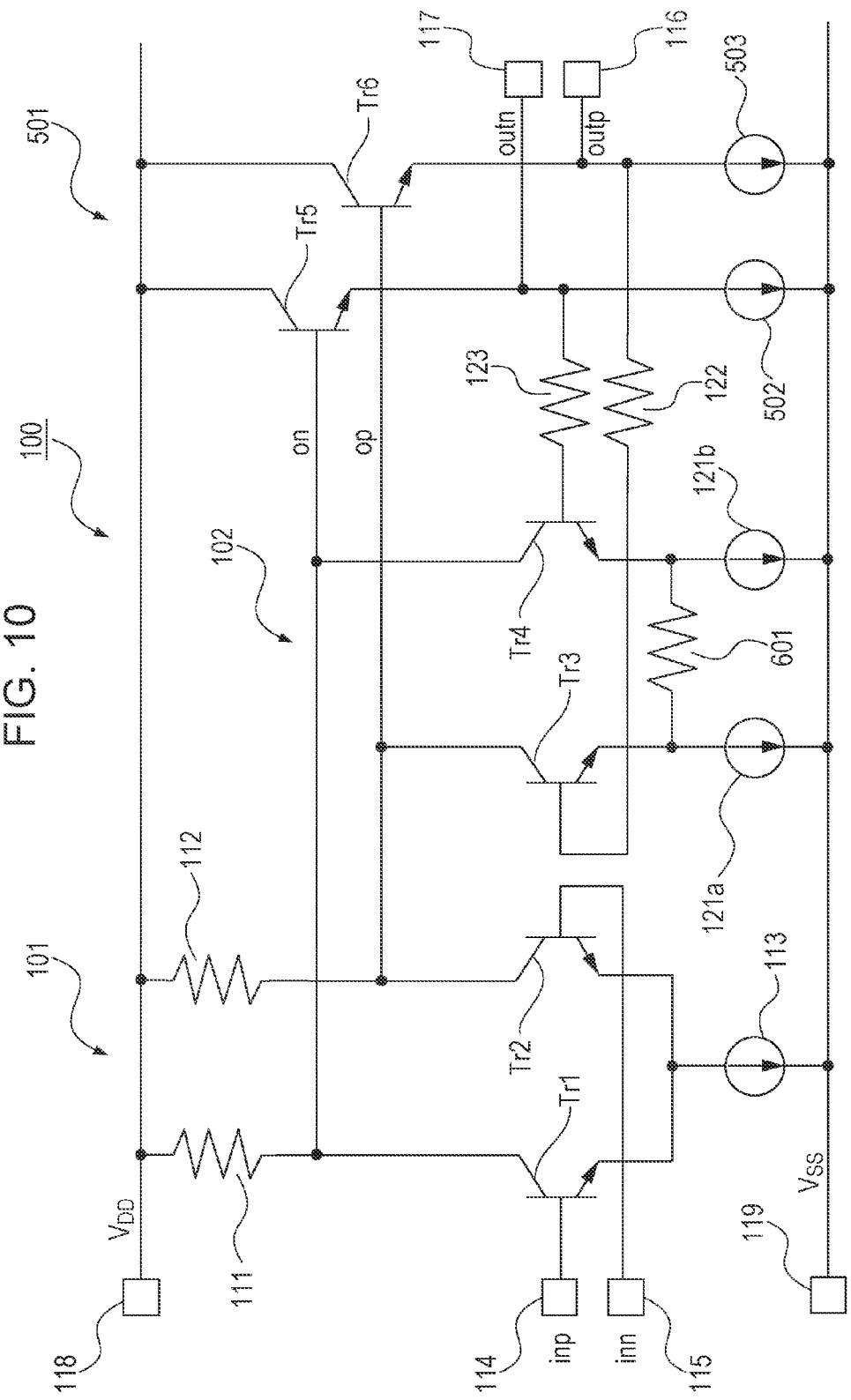
FIG. 10 illustrates an amplifier circuit according to a fifth embodiment.

FIG. 10 illustrates an amplifier circuit according to a fifth embodiment. In the fifth embodiment, a resistor 601 is connected between the emitters of a pair of transistors Tr3 and Tr4 of the feedback circuit 102 in addition to the configuration of the third embodiment (FIG. 5). The emitters of the transistors Tr3 and Tr4 are connected to the power source terminal 119 to which power source voltage $V_{SS}$ is applied, via current sources 121a and 121b respectively.

According to the above-described configuration, the resistor 601 which is provided between the emitters of a pair of transistors Tr3 and Tr4 of the feedback circuit 102 enables enhancement of linearity of a feedback signal and suppression of an effect of a non-linear component of a signal component, a limiter, and the like. Further, it is possible to realize a wider bandwidth and speeding up while maintaining a waveform of an inputted emphasis signal or the like.

Figure 11:
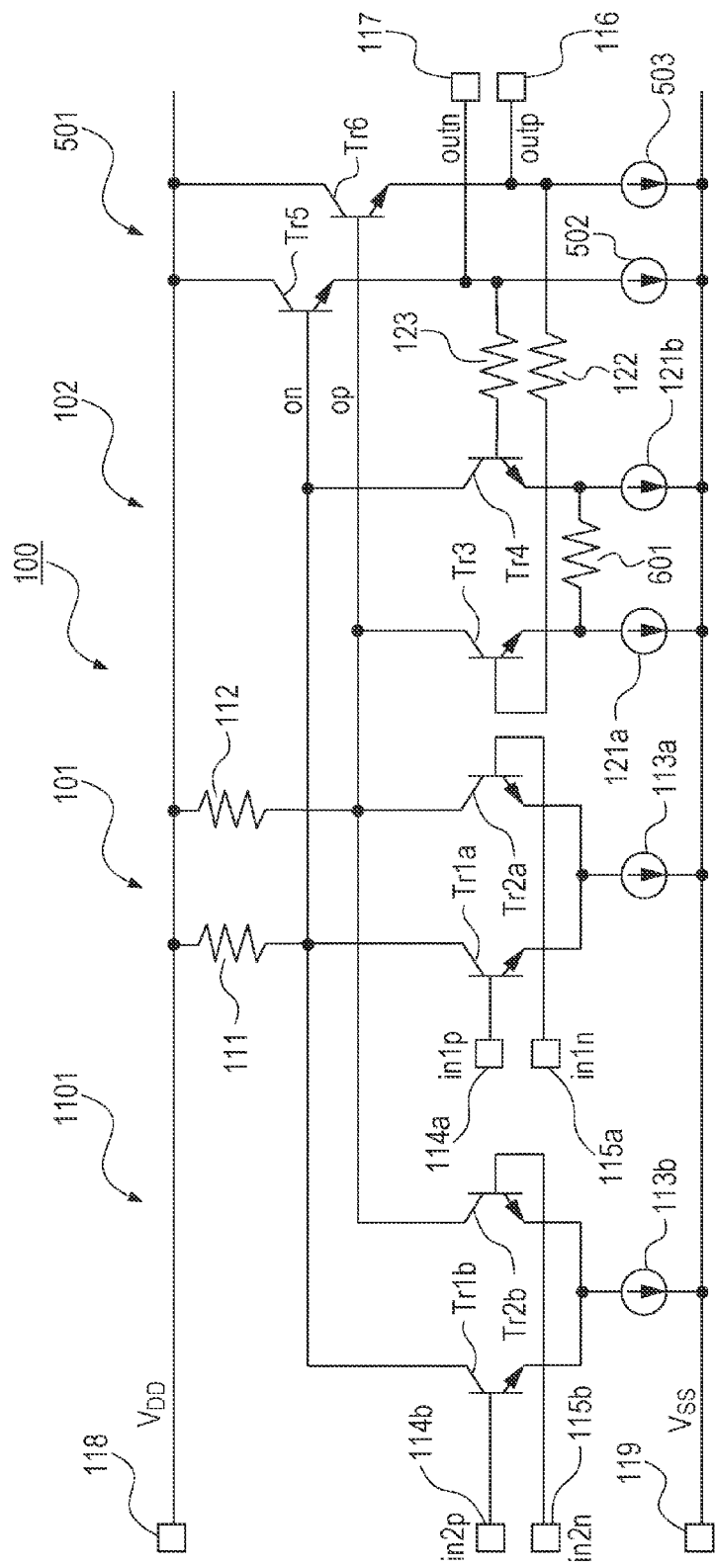
FIG. 11 illustrates an amplifier circuit according to a sixth embodiment.

FIG. 11 illustrates an amplifier circuit according to a sixth embodiment. In the sixth embodiment, an adder circuit 1101 is added to the configuration of the fifth embodiment (FIG. 10). The adder circuit 1101 has the same configuration as the configuration of the above-described differential amplifier circuit 101. A subscript a is added to reference characters of respective elements of the differential amplifier circuit 101 and a subscript b is added to reference characters of respective elements of the adder circuit 1101.

The adder circuit 1101 includes a pair of input terminal (in2p) 114b and (in2n) 115b. A collector of a transistor Tr1b of the adder circuit 1101 is connected to the signal line on and the resistor 111, and a collector of a transistor Tr2b is connected to the signal line op and the resistor 112.

In such configuration as well, the resistor 601 which is provided between the emitters of the transistors Tr3 and Tr4 of the feedback circuit 102 is capable of suppressing a non-linear component of a feedback signal component, a limiter, and the like. Especially, when such configuration is employed that an emphasis signal is generated by using the adder circuit 1101, it is possible to feed back a signal while maintaining the emphasis signal due to an effect of improvement of the linearity by the resistor 601 provided between the emitters. Therefore, it is possible to realize a wider bandwidth and speeding up while maintaining a waveform of this emphasis signal and the like.

Figure 12:
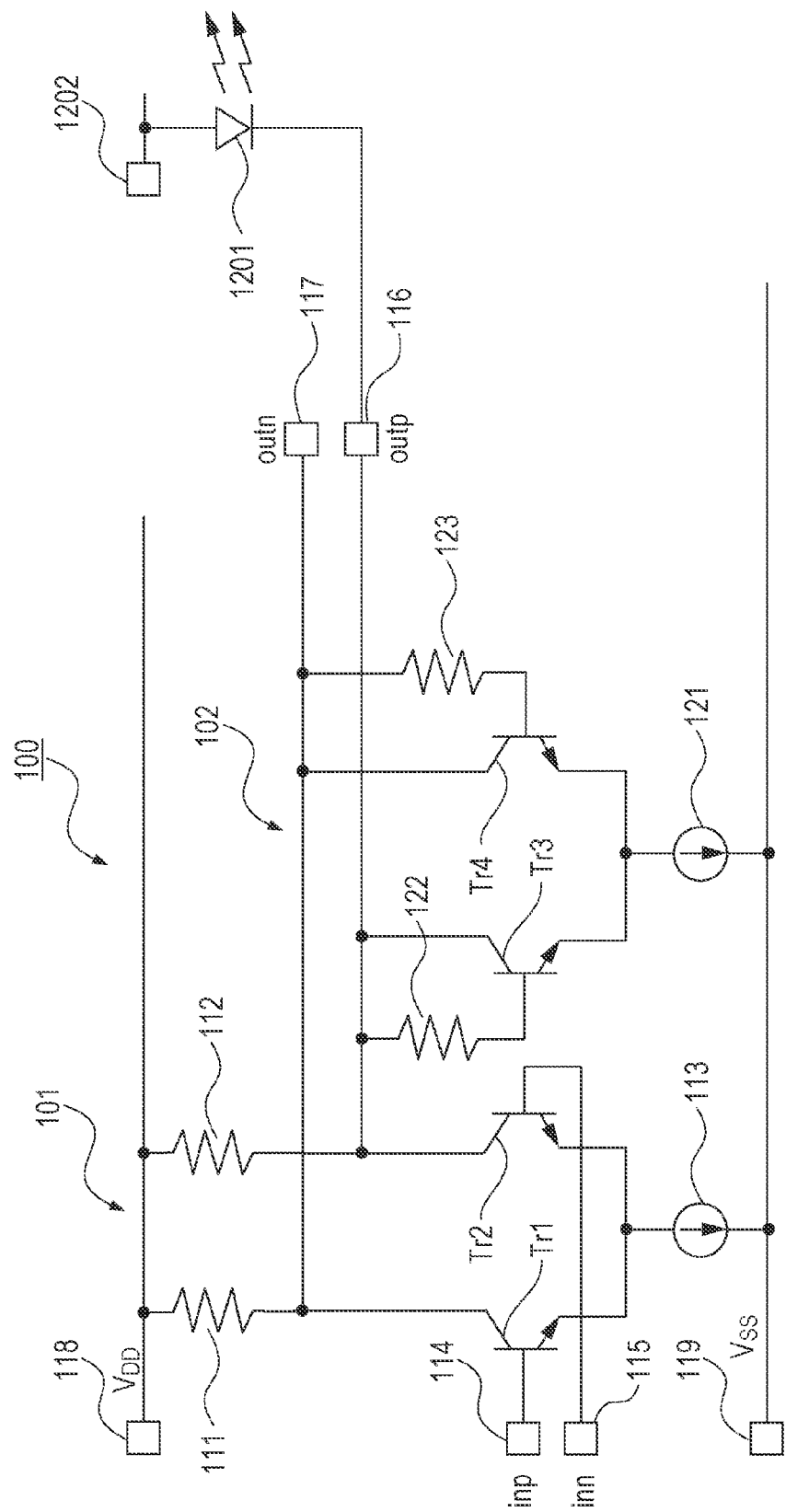
FIG. 12 illustrates a laser driving circuit according to a seventh embodiment (I)
Figure 13:
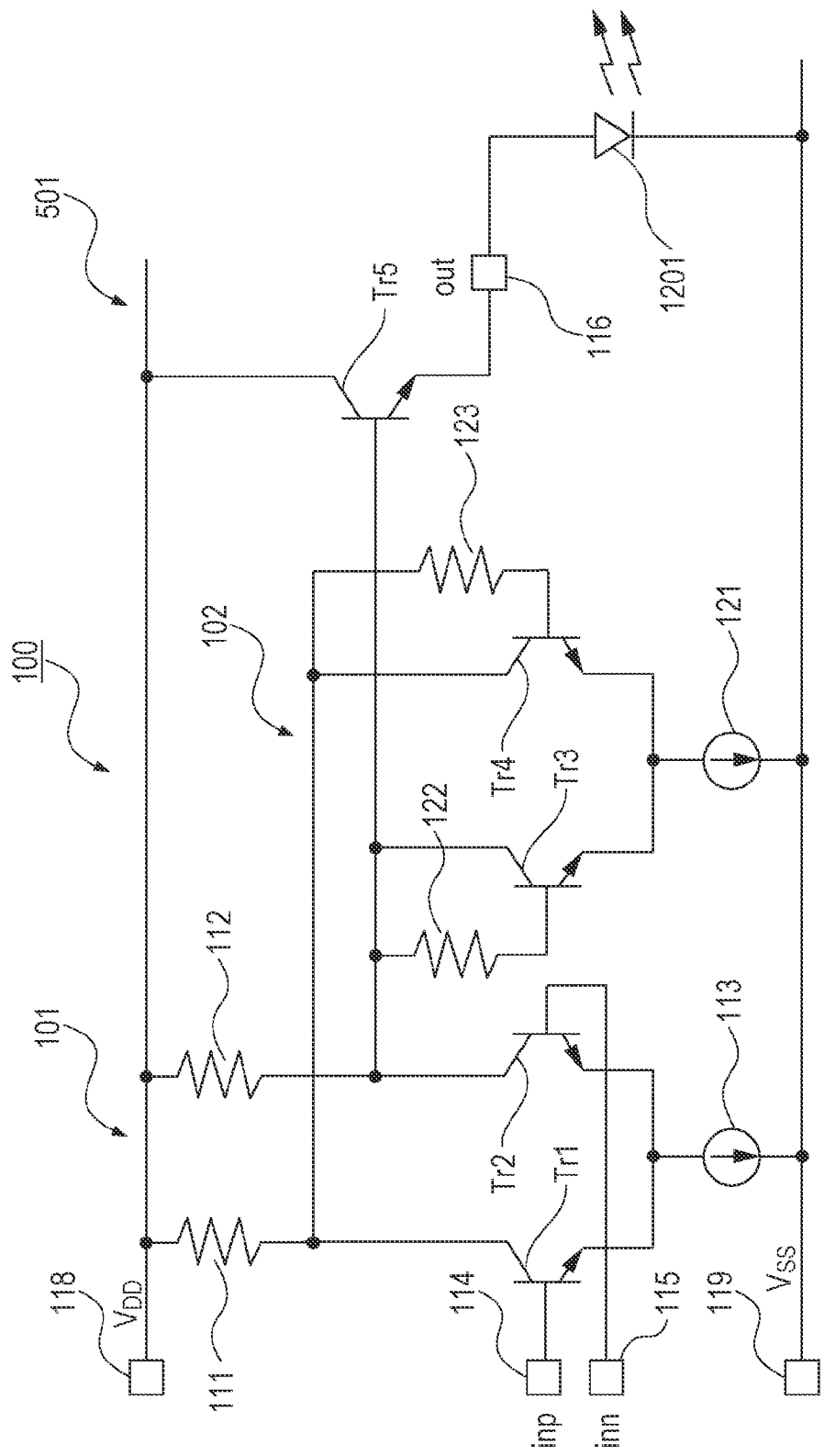
FIG. 13 illustrates a laser driving circuit according to the seventh embodiment (II)
Figure 14:
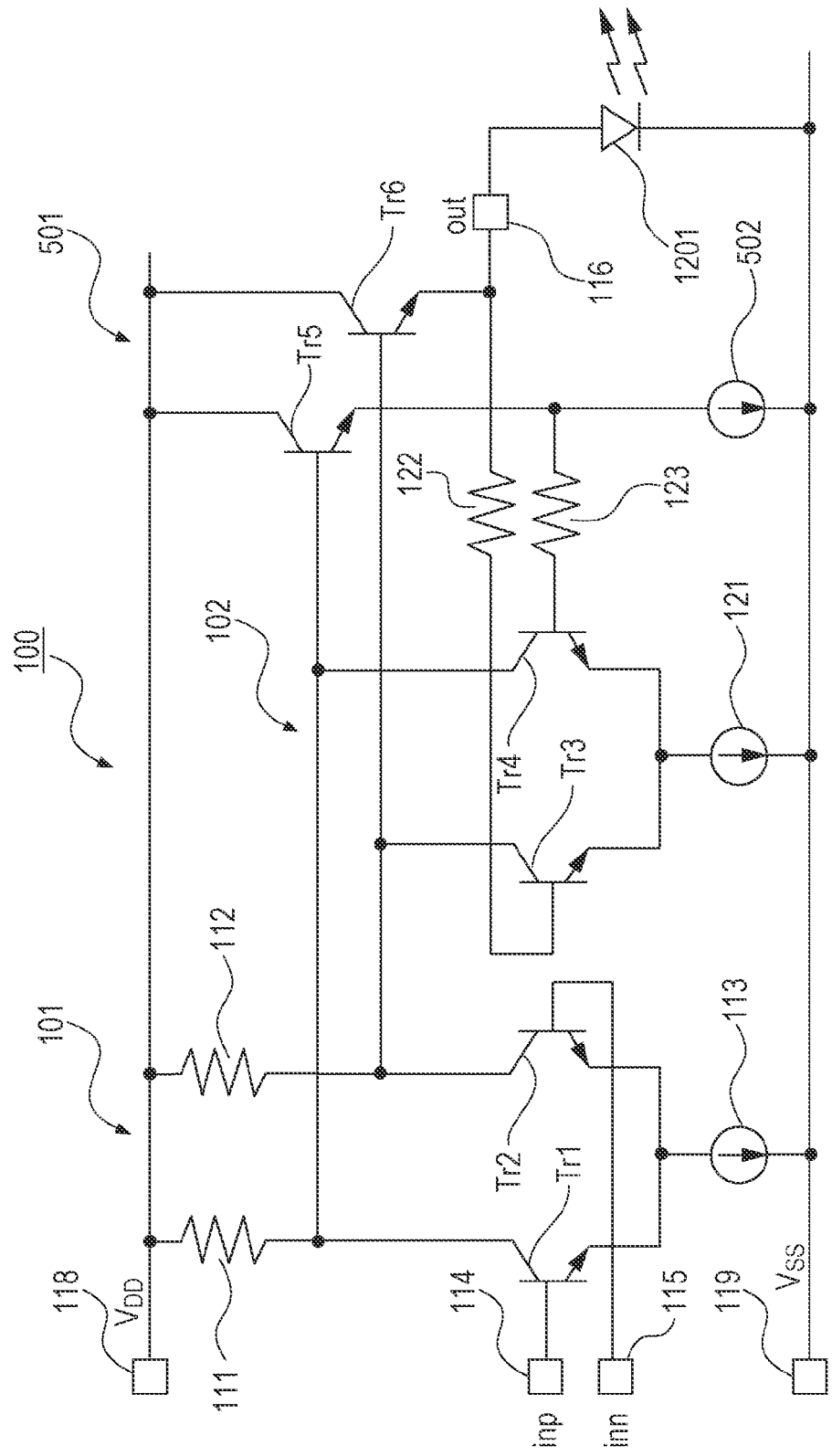
FIG. 14 illustrates a laser driving circuit according to the seventh embodiment (III).

FIGS. 12 to 14 illustrate a laser driving circuit according to a seventh embodiment. The amplifier circuit 100 described above is applicable to a laser driving circuit which drives a laser element such as a LD to make the laser element emit light by an output signal, for example.

In a circuit depicted in FIG. 12, one output (outp) of the amplifier circuit 100 of the first embodiment (FIG. 1) is connected to a cathode of a laser element 1201 and an anode is connected to an external power source terminal 1202. A circuit depicted in FIG. 13 has the configuration in which the emitter-follower circuit 501 is added to the circuit depicted in FIG. 12. In a circuit depicted in FIG. 14, the emitter-follower circuit 501 includes a pair of transistors Tr5 and Tr6, the current source 502 is provided to the transistor Tr5, and an emitter of the transistor Tr6 is an output. The emitter-follower circuit 501 is capable of supplying driving current of the laser element 1201.

As depicted in FIGS. 12 to 14, in the configuration in which the laser element 1201 is driven to emit light by the amplifier circuit 100, as well, the resistors 122 and 123 which are respectively connected with the bases of the transistors Tr3 and Tr4 of the feedback circuit 102 in series shield base capacitances of the transistors Tr3 and Tr4. Accordingly, it is possible to suppress band deterioration due to the transistors Tr3 and Tr4 for feedback and to drive the laser element 1201 at a high speed.

Further, the provision of the emitter-follower circuit 501 enables widening of a band with respect to the laser element 1201 and supply of a driving signal which is speeded up without receiving an effect of a non-linear component of a signal component, a limiter, and the like while maintaining a waveform of an outputted signal.

According to the respective embodiments described above, a resistor is connected to a base of a transistor of the feedback circuit in series, being able to obtain an advantageous effect to suppress the parasitic capacitance $C_2$ by a shield of this resistor. Further, this resistor functions as a RC filter with a parasitic capacitance of a base of a transistor, thereby simultaneously providing an advantageous effect of reduction of high frequency range components in a subtraction amount by feedback.

Further, a passive device which is a resistor is used for a feedback system, so that a signal is fed back via no other active circuits. Therefore, high-speed amplification while maintaining a waveform of a signal is enabled in a manner to hardly receive an effect of a limiter circuit and a non-linear circuit.

Though the example in which the bipolar type transistors are used is described above in the respective embodiments, in addition to or in replacement of this configuration, the configuration in which other semiconductor elements such as FETs are used may be employed. In the case using FETs as well, the configuration in which a resistor is connected between a gate and a drain enables cancellation of a parasitic capacitance of the gate, realizing a wider bandwidth and speeding up.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. An amplifier circuit, comprising:
an input-part amplifier circuit that emitter-grounds a first transistor that amplifies an input signal as a voltage amplifier, the input-part amplifier circuit being a common emitter amplifier circuit; and
an emitter-grounded feedback circuit in which a collector of the first transistor is connected to an output line of the input-part amplifier circuit, and a base of a feedback transistor is wiring-connected only to the output line by using a resistor.
2. The amplifier circuit according to claim 1, wherein
the input-part amplifier circuit is a differential amplifier circuit that includes a second transistor, the second transistor making a pair with the first transistor, and a pair of output lines of a positive phase and a reversed phase, and
in the feedback circuit, a pair of transistors and a pair of resistors are provided, a base of one transistor is connected to a collector of the one transistor that is connected to the positive phase between the pair of output lines, and a base of the other transistor is connected to a collector of the another transistor that is connected to the reversed phase.
3. The amplifier circuit according to claim 1, wherein the resistors are variable resistors.
4. The amplifier circuit according to claim 2, wherein a current source of the feedback circuit is a variable current source.

5. The amplifier circuit according to claim 2, wherein emitters of the pair of transistors of the feedback circuit are coupled with each other via a resistor.

6. The amplifier circuit according to claim 1, further comprising:
an emitter-follower circuit that is provided on an output stage of the output line; wherein
an input of the emitter-follower circuit is connected to the collectors of the transistors of the input-part amplifier circuit and an output of the emitter-follower circuit is feedback-connected to the bases of the transistors of the feedback circuit.

7. The amplifier circuit according to claim 1, further comprising:
a laser element that is connected to an output terminal of the output line; wherein
the laser element is driven to emit light by the amplifier circuit.

8. The amplifier circuit according to claim 6, further comprising:
a laser element that is connected to an output terminal of the output line; wherein
the laser element is directly driven to emit light by the emitter-follower circuit.

9. The amplifier circuit according to claim 1, wherein an adder circuit that amplifies an input signal is provided as the input-part amplifier circuit.

10. An amplifier circuit, comprising:
an emitter-grounded amplifier circuit that amplifies an input signal as a voltage amplifier, the emitter-grounded amplifier circuit being a common emitter amplifier circuit; and
an emitter-grounded feedback circuit that includes a transistor of which a collector is connected to an output line of the amplifier circuit and a base of a feedback transistor is coupled with the output line via a resistor.

\* \* \* \* \*